United States Patent [19]

DoMinh

[11] Patent Number: 4,865,950
[45] Date of Patent: Sep. 12, 1989

[54] LAMINATE FOR THE FORMATION OF BEAM LEADS FOR IC CHIP BONDING FEATURING IMPROVED POSITIVE-WORKING RESIST

[75] Inventor: Thap DoMinh, Rochester, N.Y.

[73] Assignee: Eastman Kodak Co., Rochester, N.Y.

[21] Appl. No.: 146,632

[22] Filed: Jan. 21, 1988

[51] Int. Cl.$^4$ .................. G03C 1/94; G03C 1/68
[52] U.S. Cl. ................... 430/275; 430/277; 430/156; 430/906
[58] Field of Search ............. 430/156, 275, 277, 906

[56] References Cited

U.S. PATENT DOCUMENTS 4,107,155  8/1978  Fletcher et al.
4,247,623  1/1981  Guild.
4,684,599  8/1987  DoMinh et al.

FOREIGN PATENT DOCUMENTS 1335095  1/1971  United Kingdom.

Primary Examiner—Paul R. Michl
Assistant Examiner—Thorl Chea
Attorney, Agent, or Firm—William J. Davis

[57] ABSTRACT

A laminate, adapted for manufacturing frames of metal beam leads that are bonded to integrated circuit chips, comprises
(a) a flexible metal strip,
(b) a layer of a first resist adhered to one surface of the metal strip, and
(c) a layer of a second resist adhered to the opposite surface of the metal strip, wherein said second resist is a positive-working resist having a polysulfonamide binder whereby improved mechanical properties including flexibility and adhesion to the metal are obtained.

6 Claims, No Drawings

LAMINATE FOR THE FORMATION OF BEAM LEADS FOR IC CHIP BONDING FEATURING IMPROVED POSITIVE-WORKING RESIST

FIELD OF THE INVENTION

This invention relates to a laminate adapted for manufacturing frames of metal beam leads that are bonded to integrated circuit (IC) chips, preferably by automated equipment.

BACKGROUND OF THE INVENTION

One of the most costly aspects of IC technology is bonding the IC chip to the rest of the circuit package. A proposed solution to this problem comprises automated bonding of metal beam leads to the IC chip, thus avoiding manual wire bonding. Such a technique uses a roll of a laminate that carries to a bonding station a plurality of frames each of which has many generally planar microscopic, spider-shaped metal fingers known as beam leads. At the bonding station the inner portions of the beam leads are aligned and then simultaneously connected to the bonding sites on the IC chip. The outer portion of the beam leads is then available for bonding to remaining portions of the circuit package.

Such beam leads can be manufactured by a photoresist process. U.S. Pat. No. 4,247,623 discloses such a process and a blank or laminate for use therein having a structure comprising a flexible strip of electrically conductive metal, a layer of positive-working resist adhered to one surface of the metal strip, and a layer of negative-working resist adhered to the opposite surface of the metal strip. The process includes the steps of imagewise exposing and developing the positive-working resist and the negative-working resist. The developed positive resist forms a protective coating on the beam lead portions of the metallic layer. The exposed metallic layer is subsequently etched to form the beam leads. The developed negative resist forms a window-bearing support spacer holding the beam leads in the desired orientation. The beam leads are maintained in their proper orientation prior to and during bonding by the spacer formed from the negative-working resist.

Commonly owned U.S. patent application Ser. No. 77,715, now U.S. Pat. No. 4,792,517 entitled LAMINATE FOR THE FORMATION OF BEAM LEADS FOR IC CHIP BONDING, filed July 24, 1987 discloses a laminate featuring an improved negative-working resist exhibiting good flexibility and adhesion to the metal and excellent performance during high temperature processing whereby it serves effectively as a support for the beam leads.

The above-described laminates contain positive-working resists comprising light-sensitive cresol formaldehyde resins condensed with quinone diazides in a binder such as a poly(acrylic acid) or a copolymer of ethyl acrylate and methacrylic acid. Such positive-working resists provide, under most conditions, excellent laminates. However, their performance under all conditions has not been entirely satisfactory. For example, such resists tend to be brittle, which can lead to pick-off problems during coating and cracking due to development. Furthermore, such resists have a tendency to exhibit poor adhesion to the metal which can lead to delamination during the multiple bending and flexing that is characteristic of the processing of such laminates.

Thus, the problem of this invention has been to provide a laminate for the formation of beam leads for IC chip bonding featuring a positive-working resist having the advantages, including good resolving power and etch resistance, of the positive-workng resists described above, yet featuring improved mechanical properties.

SUMMARY OF THE INVENTION

I have found that certain polysulfonamides in admixture with a sensitizer comprising a photoacid generator provide positive-working flexible and non-brittle photoresist compositions having excellent speed, resolving power and etch resistance and improved adhesion.

More particularly, in accordance with the present invention, there is provided a laminate comprising a flexible metal strip, a layer of a first resist adhered to one surface of the metal strip, and a layer of a second resist adhered to the opposite surface of the metal strip, the second resist being a positive-working resist comprising a polymer binder and a sensitizer effective, when exposed to activating radiation, to provide alkali solubility to the resist composition. The second resist is improved in that it comprises a polymer binder consisting essentially of a polysulfonamide copmrising recurring units having the structural formula:

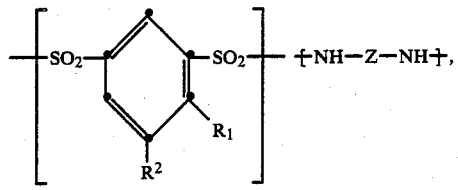

wherein:
$R^1$ and $R^2$ are individually H, halogen or alkyl containing from 1 to 3 carbon atoms,
Z is

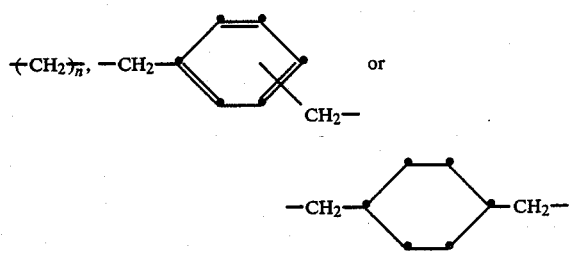

and n is 3–12.

The laminate is capable of providing superior metal beam leads that can be bonded to IC chips.

It is a particularly advantageous feature of the invention that the second resist exhibits improved mechanical properties including flexibility and excellent adhesion to the metal strip due to the polysulfonamide binder, while exhibiting the excellent resolving power and etch resistance required to provide the metal leads. Moreover, the resist exhibits minimal pick-off and cracking due to development.

It is another advantageous feature of this invention that the above-described second resist exhibits good dissolution properties in aqueous alkaline developers while avoiding residual entrapment of dye formed from photoreduction of quinone diazide sensitizer.

DESCRIPTION OF THE PREFERRED EMBODIMENTS

The laminate of this invention is described primarily in connection with a process for manufacturing frames of metal beam leads that are bonded to IC chips. In addition, the invention is useful in other photofabrication systems using developed resists on opposite sides of a workpiece.

As stated, the laminate of this invention comprises a flexible metal strip. Any electrically conductive metallic layer can be used in the invention. Preferred are copper, aluminum and other similar metals favored for use as beam leads in bonding IC chips.

The second resist composition of this invention is a positive working resist and comprises a polymer binder and a sensitizer effective, when exposed to activating radiation, to provide imagewise alkali solubility to the composition when imagewise exposed to activating radiation. The second resist is improved in that the binder consists essentially of a polysulfonamide having linear sulfonamide functionality in the polymer backbone. It has been found that such functionality provides improved mechanical properties, including flexibility and adhesion. Such polysulfonamides preferably comprise a polymer having recurring units with the structural formula set forth in the Summary above.

The polysulfonamides useful in the practice of this invention can be prepared by polycondensing in solution the appropriate diamines and aromatic disulfonyl chloride, or by any other suitable polymerization condensation techniques. Preferred herein are the specific methods described in U. S. Patent No. 4,107,155. Polysulfonamides prepared by such techniques having a linear sulfonamide backbone have been found to provide desirable pKa values, for example, greater than about 10, and good dissolution properties.

On the other hand, polysulfonamides prepared by addition polymerization having pendant sulfonamide groups have been found to be unsuitable due to low pKa, large thickness loss upon dissolution and poor mechanical performance.

Highly advantageous representative examples of polymers useful in the practice of this invention include:
poly(hexamethylene-2-4-toluenedisulfonamide) [A6];
poly(1,4-cyclohexylenedimethylene-2,4-toluenedisulfonamide) [ACy];
poly(1,3-xylylene-2,4-toluenedisulfonamide) [AXy];
poly(ethylene-co-1,4-cyclohexylenedimethylene-2,4-toluenedisulfonamide) [AC2y]
poly(ethylene-co-hexamethylene-1-chloro-2,4-benzenedisulfonamide) [C26] and
poly(ethylene-co-1,3-xylylene-1,6-dichloro-2, 4-benzenedisulfonamide) [D2Xy].

Particularly preferred polysulfonamides comprise recurring units selected from the group consisting of:

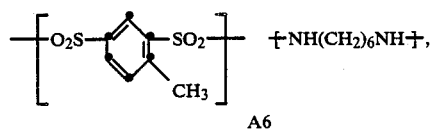

A6

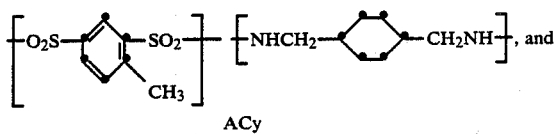

ACy

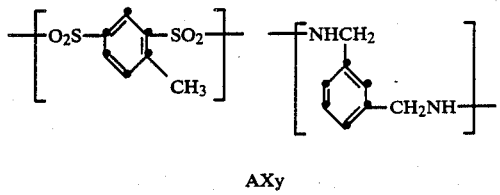

AXy

The second resist comprises in addition to the binder, a sensitizer effective, when exposed to activating radiation, to provide alkali solubility to the composition. In other words, the sensitizer is sensitive to activating radiation to produce decomposition products that are more soluble in a selected developer solvent than the original sensitizer.

Preferred sensitizers for use herein are quinone diazide compounds, for example, esters and amides formed from o-quinone diazide sulfonic and carboxylic acids. These esters and amides are well known in the art and the methods used to make them are also well known. For example, U.S. Pat. No. 4,439,516 and the references noted therein describe such compounds and methods for the preparation thereof.

Particularly preferred quinone diazide compounds include

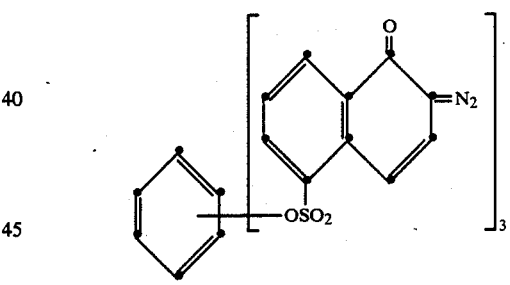

The second resist is prepared by admixing the binder of the invention in an appropriate coating solvent along with the sensitizer and optional addenda such as dyes, pigments, surfactants, plasticizers, stabilizers and the like, all of which are conventional.

The first resist can be any positive-working or negative working resist capable of adhering to the selected metallic layer. For example, the negative working resist compositions described in U.S. Pat. No. 4,247,623 are acceptable. However, a preferred first resist for use herein is the negative-working resist described in U.S. application Ser. No. 77,715, now U.S. Pat. No. 4,792,517 noted above, the disclosure of which is incorporated herein by reference. That is, the first resist can be a negative-working resist preferably comprising a polymer binder having a glass transition temperature of at least 150° C., a photopolymerizable monomer mixture comprising a monomer having the structural formula

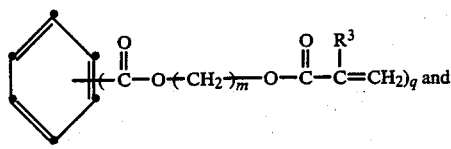

a monomer having the structural formula

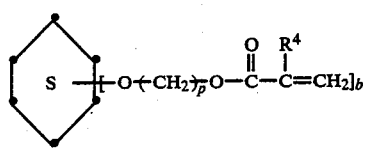

wherein q is 1, 2, 3 or 4, b is 1 or 2, m and p are integers of from 1 to 10, and $R^3$ and $R^4$ are individually H or $CH_3$, and a photoinitiator composition, such as a mixture of an amine and a 3-ketocoumarin.

For use as a laminate for the formation of beam leads, the dried second resist preferably has a thickness of from 7 to about 50 microns. The metallic layer preferably has a thickness of from 5 to about 100 microns, and the first resist preferably has a thickness of from 10 to about 250 microns, although other thicknesses outside these ranges may be useful in certain applications. The developed second resist forms a protective coating on the beam lead portions of the metallic layer. The developed first resist forms a support holding the beam leads in the desired orientation. The exposed metallic layer is etched to form the beam leads.

In a preferred embodiment of this invention, the first resist is a positive-working rseist comprising a polymer binder and a sensitizer effective, when exposed to activating radiation, to provide alkali solubility to the resist composition wherein the polymer binder of the first resist consists essentially of a polysulfonamide, as described for the second resist described above. the developed first resist having a polysulfonamide binder forms an effective supoort for the bead leads during subsequent bonding.

The photoresists useful in the practice of this invention can be applied to the metal layer by a wide variety of techniques, including coating techniques such as spin-coating, spray coating, bead coating, curtain coating, roller coating and the like, all of which are conventional.

A particularly useful solvent for the positive working resist is acetone. However, other suitable solvents such a 2-butanone, tetrahydrofuran, p-dioxane, cyclohexanone, cyclopentanone and other ketones, 2-methoxyethanol, 2-ethoxyethanol, and other alcohols can be employed, and are also useful in preparing the coating of the negative-working resist, if present.

The laminate can optionally include a removable cover sheet for one or both resist layers. Such a sheet is particularly useful for formulations that tend to be somewhat tacky or oxygen sensitive. The cover sheet can be either preformed and then laminated to the resist layer, or it can be cast in place as a film from a water-soluble polymer. Examples of the former include cellulose esters such as cellulose triacetate, polyamides, polyolefins, vinyl polymers and polyesters. Examples of the latter include poly(vinyl alcohol) or hydroxyalkyl cellulose of from 1-2 carbon atoms in the alkyl portion. A preferred thickness of such cover sheets is from 12 to 50 microns.

A preferred method of storage of the laminate of the invention is in strip form coiled upon a suitable spool or mandrel into a roll. In such cases, the cover sheet is one which prevents transfer of monomer to the next adjacent section of the strip. Useful materials having such a property include polyester films.

As noted, the laminate of this invention is particularly adapted for manufacturing frames of metal beam leads that are bonded to IC chips. The processes of forming the frames and bonding the IC chis to such frames are adequately described in aforedescribed U. S. Pat. No. 4,247,623, the disclosure of which is hereby incorporated by reference in its entirety. Such process preferably is carried out in a continuous mode. The washes used to remove portions of the resists contain conventional resist developers, such as aqueous bases, buffered aqueous bases, 1,1,1-trichloroethane, dichloromethane, acetone, benzene, alcohols, ethers, toluene, KMPR-809 developer, available from KTI Chemicals, Inc., and the like. Particularly preferred developers for the positive-working resist include silicone buffered phosphate aqueous bases and those described in U. S. Pat. No. 4,141,733 and European Pat. No. 23,758, e.g., quaternary alkanol ammonium hydroxides containing a sulfite stabilizer.

EXAMPLES

The following Examples further illustrate the invention.

EXAMPLE 1 and COMPARATIVE EXAMPLE I

A coating solution comprising 22% by weight *A2Cy (Mw=400,000, Tg=140° C.) in acetone and 3% 1,2,4-tris(6-diazo-5,6-naphthoquinone-1-sulfonyloxy) benzene, (a monomeric sensitizer) was machine coated onto a flexible copper support and dried to a thickness of 5-10 microns.

*A2Cy

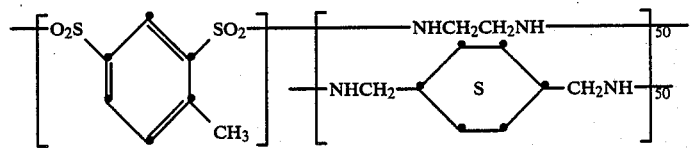

The A2Cy resist exhibited excellent adhesion to the support, excellent cohesive strength, good etch resistance and good resolving power (15 micron line/40 micron space) when imagewise exposed and developed in a conventional aqueous resist developer (KMPR 809 Developer, available from KTI Chemicals, Inc.). A humidity investigation in the range 10-90% RH showed no significant effect on the performance of the material.

A control positive-working resist prepared from the formulation set forth in Table I below was machine coated onto a flexible copper support and dried to a thickness of 5–10 microns.

TABLE I

| Component | 809 Control Weight % |
|---|---|
| Ethoxyethyl Acetate (solvent) | 60% |
| Poly(ethylacrylate-co-methacrylic acid) | 12% |

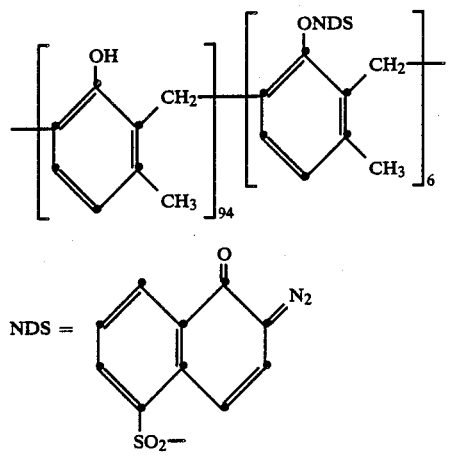

A comparison of Example 1 with the Control (Comparative Example 1) in terms of some performance characteristics is provided in Table II below.

TABLE II

| | A2Cy | 809 |
|---|---|---|
| Mechanical Properties | | |
| Adhesion | | |
| Surface Energy | γ= 50 dyne/cm | γ= 44 dyne/cm |
| Peel Strength | 125 g/cm | 54 g/cm |
| Cohesion | Flexible & tough coating no crack at 170 newtons, stress-to-break =914 Kg/cm² free film) | Brittle film; Estar coating cracked at 140 newtons. No free film possible due to brittleness. |
| Photospeed (erg/cm²) | | |
| 5 micron coating | 300 | 220 |

TABLE II-continued

| | A2Cy | 809 |
|---|---|---|
| 10 micron coating | 700 | 500 |
| Dissolution Rate (Å/sec) in 33% KMPR 809 developer | | |
| unexposed | 93 | 30 |
| exposed | 7790 | 2090 |
| Selectivity (exposed/unexposed) | 80 | 65 |

EXAMPLES 2–5

Example 1 was substantially repeated with similar results when the A2Cy was replaced with A6, AXy, ACy, C26 and D2Xy.

COMPARATIVE EXAMPLE II

Example 1 was substantially repeated except that the A2Cy was replaced with A2 having the structural formula:

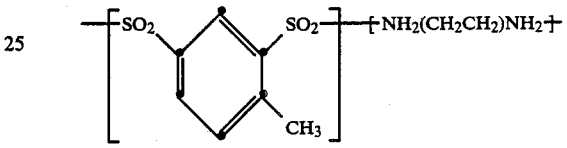

Development of this resist in an aqueous alkali developer resulted in the formation of a red dye from the quinone sensitizer and its photo-product which could not be washed out into the developer solution. It is believed that such residual entrapped dye can lead to adhesion problems, which are undesirable when the resist is used in a laminate adapted for manufacturing frames of metal beam leads that are to be bonded to IC chips. Moreover, this resist exhibited an unacceptable thickness loss upon dissolution.

EXAMPLE 6

Laminate Including Preferred Negative Working Resist

The following negative-resist formulation of Table III was coated at 40 microns dry thickness onto a 35 micron thick copper foil coated on one side with a 5 micron thick positive-working resist having the composition set forth in Example 1 above to form a continuous film strip.

TABLE III

Composition of Negative-Working Resist

Wt. %

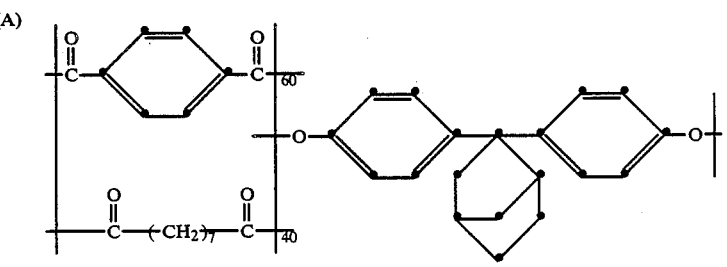

53

TABLE III-continued

Composition of Negative-Working Resist

| | | Wt. % |
|---|---|---|
| (B) | CH$_2$=CH—C(=O)—O(CH$_2$)$_{\overline{2}}$O—⟨S⟩—O(CH$_2$)$_{\overline{2}}$O—C(=O)—CH=CH$_2$ | 22.5 |
| (C) | Z=C(=O)—O(CH$_2$)$_{\overline{2}}$O—C(=O)—CH=CH$_2$ (benzene ring with three Z substituents) | 22.5 |
| (D) | Photoinitiator Composition | |
| | Ethyl-p-dimethylaminobenzoate | 1.50 |
| | 3-(4-cyanobenzoyl)-5,7-dipropoxycoumarin | 0.19 |
| (E) | Photoinhibitor | |
| | Thiobis-4,4'-(2-tert-butyl-6-methylphenol) | 0.23 |

The sample was processed as follows:

(1) The sample strip was exposed with a Colight M-218 exposing unit (400 watt mercury lamp) using a Kodak T-14 (0.15) neutral density step tablet.

(2) Exposed positive resist was immersion developed for 90 seconds in aqueous-diluted KMPR-809 developer (1:1) to completely remove the exposed areas, and generate 3 sharp steps in the step tablet area. A final water rinse was used to remove all traces of developer.

(3) The unprotected copper foil (exposed areas) was chemically removed using a HCl-CuCl$_2$ spray etcher.

(4) The protective positive resist was then removed in a stripper of KMPR-809 developer and acetone.

(5) The exposed negative resist film was then spray developed with 1,1,1-trichloroethane to remove the unexposed areas and generate 8 sharp steps in the step tablet area. A final water rinse was used to remove all traces of developer.

(6) The strip was then baked in an oven for 5 minutes at 200° C. to remove solvent and increase polymerization of the monomers.

(7) The processed tape was thermal compression bonded to gold bumped IC chips using a Jade JEMS/LAB bonder. The bonding cycle was for about 2 seconds at about 400° C.

The positive-working resist exhibited no pick-off problem during coating nor cracklines due to development and exhibited good adhesion to the copper support during processing. The laminate provided superior beam leads.

EXAMPLE 7

Laminate Including 2 Positive-Working Resists

A laminate was prepared having a positive-working resist formed from the A6 poly sulfonamide and the sensitizer described in Example 1 above on opposite sides of a 35 micron copper strip support. The first resist had a thickness of about 7.5 microns. The second resist had a thickness of about 40 microns. The first and second polysulfonamide resists can be used effectively to form beam leads and a support therefor by using the process described in Example 6 above with the following exceptons. The second resist due to its greater thickness requires 3-4 times longer exposure and development times (steps 1 and 2). No high temperature curing (step 6) is required; only a soft bake (5 min. at 100° C.) is necessary to remove residual solvent and water prior to bonding.

The invention has been described in detail with particular reference to preferred embodiments thereof, but it will be understood that variations and modifications can be effected within the spirit and scope of the invention.

What is claimed is:

1. A laminate, adapted for manufacturing frames of metal beam leads that are bonded to integrated circuit chips, said laminate comprising:

a) a flexible metal strip, b) a layer of a first resist adhered to one surface of said metal strip, and c) a layer of a second resist adhered to the opposite surface of said metal strip, wherein said second resist is a positive-working resist comprising a polymer binder and a sensitizer effective, when exposed to activating radiation, to provide alkali solubility to said composition, characterized in that said polymer binder consists essentially of a polysulfonamide comprising recurring units having the structural formula:

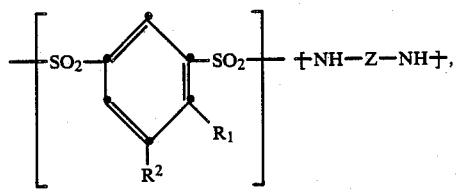

wherein:

R$^1$ and R$^2$ are individually H, halogen or alkyl containing from 1 to 3 carbon atoms, Z is

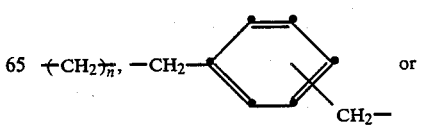

-continued

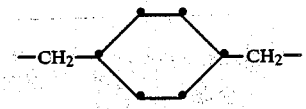

and n is 3-12.

2. The laminate of claim 1 wherein said binder of said second resist consists essentially of a polysulfonamide comprising recurring units having the formula selected from the group consisting of:

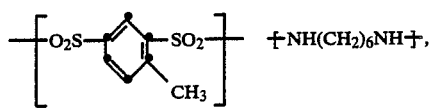

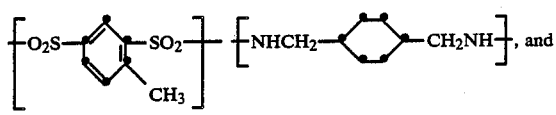

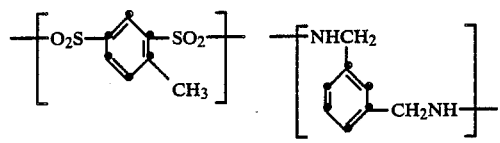

3. The laminate of claim 1 wherein said resist comprises a sensitizer selected from the group consisting of 1,2,4-tris(6-diazo-5,6-naphthoquinone-1-sulfonyloxy)-benzene and 1,3,5-tris(6-diazo-5,6-naphthoquinone-1-sulfonyloxy)benzene.

4. The laminate of claim 1 wherein said second resist has a thickness of from 7 to 50 microns.

5. The laminate of claim 1 wherein said first resist comprises
(1) a polymer binder,
(2) a photopolymerizable monomer mixture comprising a monomer having the structural formula:

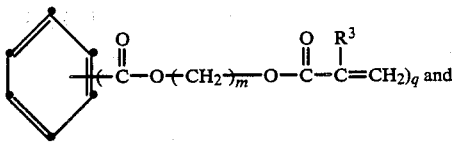

a monomer having the structural formula

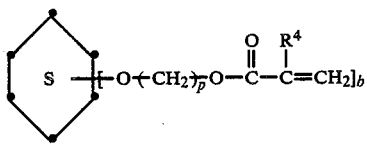

wherein
q is 2, 3 or 4,
b is 1 or 2,
m and p are integers of from 1 to 10, and
$R^3$ and $R^4$ are individually H or $CH_3$ and
(3) a photoinitiator composition.

6. The laminate of claim 1 wherein said first resist comprises a positive-working resist comrpising a polymer binder and a sensitizer effective, when exposed to activating radiation, to provide alkali solubility to said composition, wherein the polymer binder of said first resist consists essentially of a polysulfonamide.

* * * * *